(12) United States Patent
Cypher et al.

(10) Patent No.: US 7,607,069 B1
(45) Date of Patent: *Oct. 20, 2009

(54) COMPUTER SYSTEM INCLUDING NETWORK SLICES THAT MAP TO FIELD REPLACEABLE UNITS

(75) Inventors: Robert E. Cypher, Saratoga, CA (US); Drew G. Doblar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1143 days.

This patent is subject to a terminal disclaimer.

(21) Appl. No.: 10/917,167

(22) Filed: Aug. 12, 2004

Related U.S. Application Data (63) Continuation-in-part of application No. 10/185,241, filed on Jun. 28, 2002, now Pat. No. 7,050,307.

(51) Int. Cl.
*H03M 13/05* (2006.01)
*G06F 11/10* (2006.01)

(52) U.S. Cl. .............. 714/776; 714/4; 714/710

(58) Field of Classification Search .......... 714/710, 714/776
See application file for complete search history.

(56) References Cited

U.S. PATENT DOCUMENTS

| | | | |
|---|---|---|---|
| 4,507,782 A * | 3/1985 | Kunimasa et al. ........ 714/776 |
| 5,363,484 A | 11/1994 | Desnoyers et al. | |
| 5,463,644 A | 10/1995 | Rodi et al. | |
| 5,562,410 A | 10/1996 | Sachs et al. | |
| 6,035,414 A | 3/2000 | Okazawa et al. | |
| 6,052,364 A * | 4/2000 | Chalmers et al. ........ 370/312 |
| 6,354,861 B2 | 3/2002 | Schmitt et al. | |
| 7,181,674 B2 * | 2/2007 | Cypher et al. ........... 714/776 |
| 2001/0030942 A1 | 10/2001 | Suzuki | |
| 2003/0002541 A1 | 1/2003 | Fowler et al. | |
| 2004/0003158 A1 | 1/2004 | Doblar et al. | |
| 2004/0003336 A1 | 1/2004 | Cypher | |
| 2004/0003339 A1 | 1/2004 | Cypher et al. | |
| 2005/0268209 A1 * | 12/2005 | Mann .................... 714/776 |

FOREIGN PATENT DOCUMENTS

EP 1176514 A1 1/2002

* cited by examiner

*Primary Examiner*—Scott T Baderman
*Assistant Examiner*—Sam Rizk
(74) *Attorney, Agent, or Firm*—Meyertons, Hood, Kivlin, Kowert & Goetzel, P.C.

(57) ABSTRACT

In one embodiment, a computer system includes a first client subsystem, a second client subsystem and a network. The network is coupled to convey a packet between the first client subsystem and the second client subsystem. The network is partitioned into a plurality of network slices and the packet is partitioned into a plurality of packet slices. Each packet slice is conveyed on a respective one of the plurality of network slices. At least one of the plurality of packet slices includes redundant information associated with the packet and is usable to regenerate at least another of the plurality of packet slices. In addition, each of the plurality of network slices corresponds to a field replaceable hardware unit.

22 Claims, 6 Drawing Sheets

COMPUTER SYSTEM INCLUDING NETWORK SLICES THAT MAP TO FIELD REPLACEABLE UNITS

This application is a continuation in-part of U.S. patent application Ser. No. 10/185,241, filed Jun. 28, 2002 now U.S. Pat. No. 7,050,307, entitled "Circuit Board Orientation In A Computer System."

BACKGROUND OF THE INVENTION

1. Field of the Invention

This invention relates to computer system reliability and availability and, more particularly, to mapping the network interconnect into field replaceable units.

2. Description of the Related Art

Computer systems are typically available in a range of configurations which may afford a user varying degrees of reliability, availability and serviceability (RAS). In some systems, reliability may be paramount. Thus, a reliable system may include features designed to prevent failures. In other systems, availability may be important and so systems may be designed to have significant fail-over capabilities in the event of a failure. Either of these types of systems may include built-in redundancies of critical components. In addition, systems may be designed with serviceability in mind. Such systems may allow fast system recovery during system failures due to component accessibility. In critical systems, such as high-end servers and some multiple processor and distributed processing systems, a combination of the above features may produce the desired RAS level.

One way of achieving high reliability and availability in systems is through the use of error codes. Error codes are commonly used in electronic systems to detect and correct errors such as transmission errors or storage errors. For example, error codes may be used to detect and correct errors in information transmitted via a communication link within a computer system. Error codes may additionally be used to detect and correct errors associated with information stored in the memory or mass storage devices of computer systems. One common use of error codes is to detect and correct errors in information transmitted on a bus within a computer system. In such systems, error correction bits, or check bits, may be generated for data prior to its transfer or storage. The check bits may then be transmitted or stored with the data. When the data is received or retrieved, the check bits may be used to detect and/or correct errors within the data. The use of error codes within a computer system may increase the data integrity of that system by detecting errors as soon as they occur. Similarly, the use of error codes may improve system availability by allowing the system to continue to function despite one or more failures.

SUMMARY

Various embodiments of a computer system including a network partitioned into slices that are mapped to field replaceable units are disclosed. In one embodiment, the computer system includes a first client subsystem, a second client subsystem and a network. The network may be coupled to convey a packet between the first client subsystem and the second client subsystem. The network is partitioned into a plurality of network slices and the packet is partitioned into a plurality of packet slices. Each packet slice may be conveyed on a respective one of the plurality of network slices. At least one of the plurality of packet slices includes redundant information such as parity information, for example, that is associated with the packet. The redundant information is usable to regenerate at least another of the plurality of packet slices. In addition, each of the plurality of network slices corresponds to a field replaceable hardware unit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Figure 1:
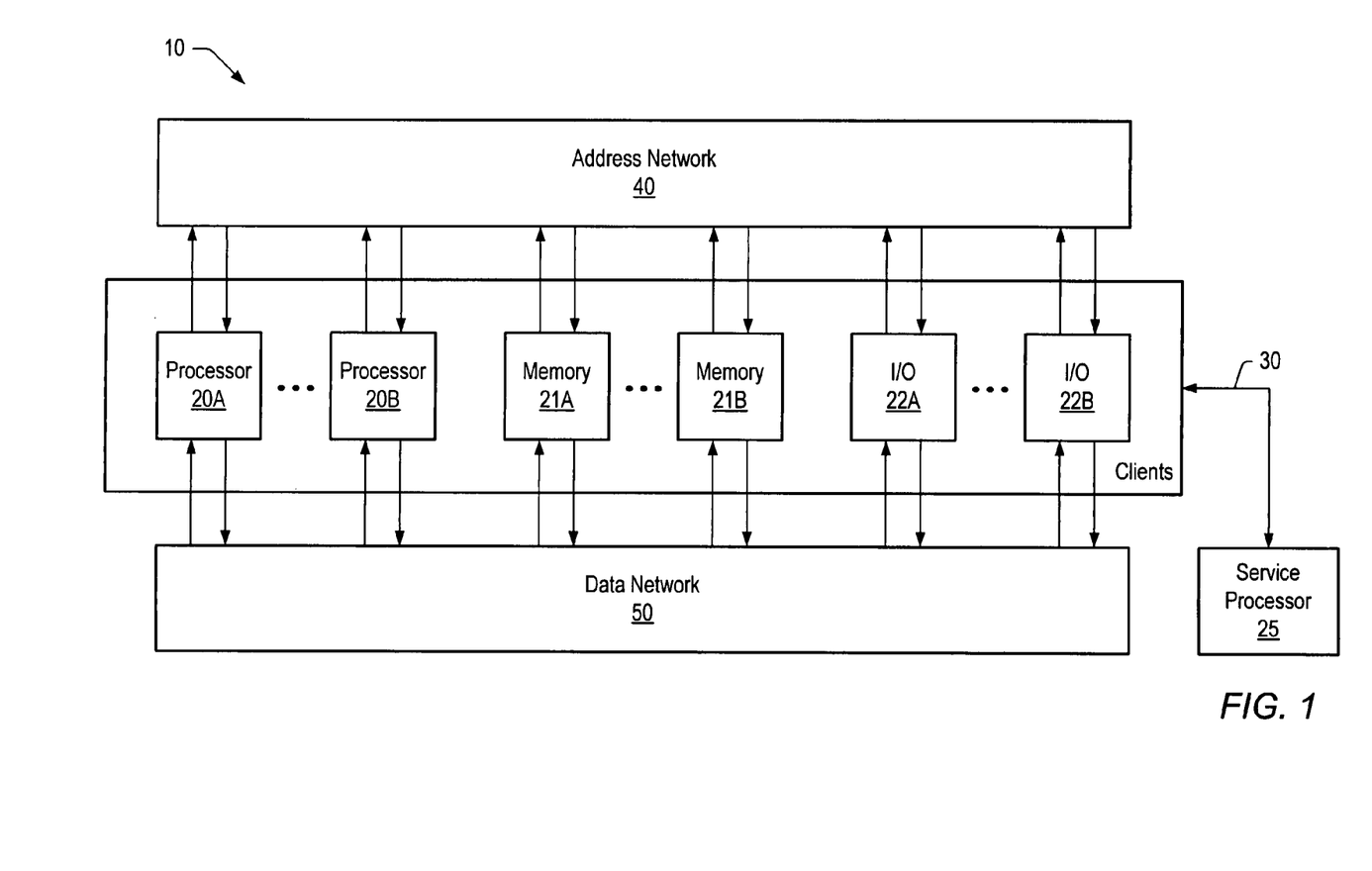
FIG. 1 is a block diagram of one embodiment of a computer system.

Turning now to FIG. 1, a block diagram of one embodiment of a computer system 10 is shown. Computer system 10 includes multiple devices interconnected through an address network 40 and a data network 50. The devices include processor devices 20A and 20B, memory devices 21A and 21B, and I/O devices 22A and 22B. Each of the devices is referred to herein as a client device or client subsystem. In some embodiments, each of the client devices may be coupled to a diagnostic or service processor 25 via an independent communication medium 30. In one embodiment communication medium 30 may include separate signal lines coupling each client to the service processor 25.

It is noted that embodiments of computer system 10 employing any number of clients and different combinations of client types may be implemented. Elements referred to herein with a particular reference number followed by a letter may be collectively referred to by the reference number alone. For example, processor devices 20A-20B may be collectively referred to as processor devices 20. Note that the embodiment shown in FIG. 1 is a logical representation of computer system 10 and that the physical implementation of computer system 10 may appear significantly different. Note also that in some embodiments, certain client devices may include multiple types of functionality. For example, in an alternative embodiment, one client device may implement both processor and memory device functionality while another client device may implement processor, memory, and/or I/O functionality.

Each of processor devices 20 and I/O devices 22 may access each of memory devices 21. Devices such as these that are configured to perform accesses to memory devices 21 are referred to herein as "active" devices. Each client device in FIG. 1 may be configured to convey address messages on address network 40 and data messages on data network 50 using packets such as split-transaction packets, for example. Each processor device 20 in the illustrated embodiment may include one or more processors (not shown). Processor devices 20 may also include one or more instruction and data caches (not shown) that may be configured in any of a variety of specific cache arrangements. For example, set-associative or direct-mapped configurations may be employed by the caches within processor devices 20.

Memory devices 21 are configured to store data and instruction code for use by processor devices 20 and I/O devices 22. Memory devices 21 preferably include dynamic random access memory (DRAM) components, although other types of memory components may be used. The memory within memory devices 21 may be implemented using memory modules (e.g., dual in-line memory modules (DIMMs), Rambus in-line memory modules (RIMMs), or single in-line memory modules (SIMMs)). Each address may map to a particular memory device, which is referred to herein as the home device or subsystem of that address.

I/O devices 22 may each be illustrative of a peripheral device such as an input-output bridge, a graphics device, a networking device, etc. In various embodiments, one or more of the I/O devices 22 may include a cache memory subsystem similar to those of processor devices 20 for caching data associated with addresses mapped within one of the memory subsystems. Some addresses may also be mapped to I/O devices 22.

In one embodiment, data network 50 may be a logical point-to-point network. Data network 50 may be implemented as an electrical bus, a circuit-switched network, or a packet-switched network. In embodiments where data network 50 is a packet-switched network, packets may be sent through the data network using switching techniques such as wormhole, store and forward, and virtual cut-through, for example. In a circuit-switched network, a particular client device may communicate directly with a second client device via a dedicated point-to-point link that may be established through a switched interconnect mechanism. To communicate with a third client device, the particular client device utilizes a different link, established by the switched interconnect mechanism, than the one used to communicate with the second client device. In one embodiment, data network 50 may implement a source-destination ordering property such that if a client device C1 sends a data message D1 before sending a data message D2 and a client device C2 receives both D1 and D2, C2 will receive D1 before C2 receives D2.

Address network 40 accommodates communication between processing devices 20, memory devices 21, and I/O devices 22. Like data network 50, address network 40 may be implemented as an electrical bus, a circuit-switched network, or a packet-switched network. Address network 40 and/or data network 50 may be implemented using a multi-stage switching hierarchy in some embodiments. Depending on the embodiment, address network 40 may be implemented in hardware that is separate from data network 50 or in hardware that is shared with data network 50.

Messages upon address network 40 are generally referred to as address packets. When an address packet references a storage location within a memory device 21, the referenced location may be specified via an address conveyed within the address packet upon address network 40. Subsequently, data corresponding to the address packet on the address network 40 may be conveyed upon data network 50. Typical address packets correspond to requests for an access right (e.g., read or write access) corresponding to a cacheable memory location or requests to perform a read or write to a non-cacheable memory location.

In one embodiment, address network 40 may implement a broadcast network in which each address packet is conveyed to all client devices coupled to the address network. In alternative embodiments, the address network may not broadcast all address packets (e.g., some address packets may conveyed to fewer than all of the client devices). In alternative embodiments, address network 40 may be implemented using a common bus structure.

In some embodiments, address network 40 may be configured to transmit coherence requests corresponding to read or write memory operations using a point-to-point transmission mode. For coherence requests that are conveyed point-to-point by address network 40, a directory-based coherency protocol may be implemented. In other embodiments, address network 40 may be configured to transmit coherence requests in broadcast mode, and a snooping broadcast coherency protocol may be implemented. In still other embodiments, address network 40 may be configured to selectively transmit coherence requests in either point-to-point mode or broadcast mode. In such embodiments, both snooping broadcast coherency protocols and directory-based coherency protocols may be implemented.

In embodiments supporting both point-to-point and broadcast transmission modes, clients transmitting a coherence request to address network 40 may be unaware of whether the coherence request will be conveyed within computer system 10 via a broadcast or a point-to-point mode transmission. In such an embodiment, address network 40 may be configured to determine whether a particular coherence request is to be conveyed in broadcast (BC) mode or point-to-point (PTP) mode. For example, one embodiment of address network 40 may include a table for classifying coherence requests as either BC mode or PTP mode dependent on a memory address specified in the coherence request.

Network Slicing

Address network 40 and/or data network 50 may each be partitioned and implemented as multiple parallel pieces. Each piece is referred to herein as a "slice." Each slice of address network 40 may convey a portion of an address packet. The address network 40 slices may each convey a respective portion of the same address packet at the same time. Similarly, each slice of data network 50 may convey a portion of a data packet. As described further below, in some embodiments, the slices of each network may be implemented as independent communication links such that the failure of one slice will not affect the operability of any other slice. The portion of a packet conveyed on a single network slice is referred to herein as a packet slice.

Each packet may include redundant information, such as parity information, that protects the information included in the remainder of the packet (e.g., the packet body and/or header). One or more slices of address network 40 and one or more slices of data network 50 may be used to convey the redundant information that corresponds to portions of the packet that are being conveyed on the other network slices. The network slices that convey redundant information for each packet may not convey portions of the body of an address or data packet in some embodiments. The redundant information may be useable to regenerate at least one of the portions of the packet conveyed on the other slices. For example, the redundant information may include parity information generated from each of the packet's packet slices. If one packet slice is lost (e.g., due to failure of the sending device or failure of one of the network slices), a receiving device may regenerate that packet slice from the parity information and the remaining packet slices. In other embodiments, the redundant information may include a duplicate copy of one or more of the associated packet slices.

Figure 2:
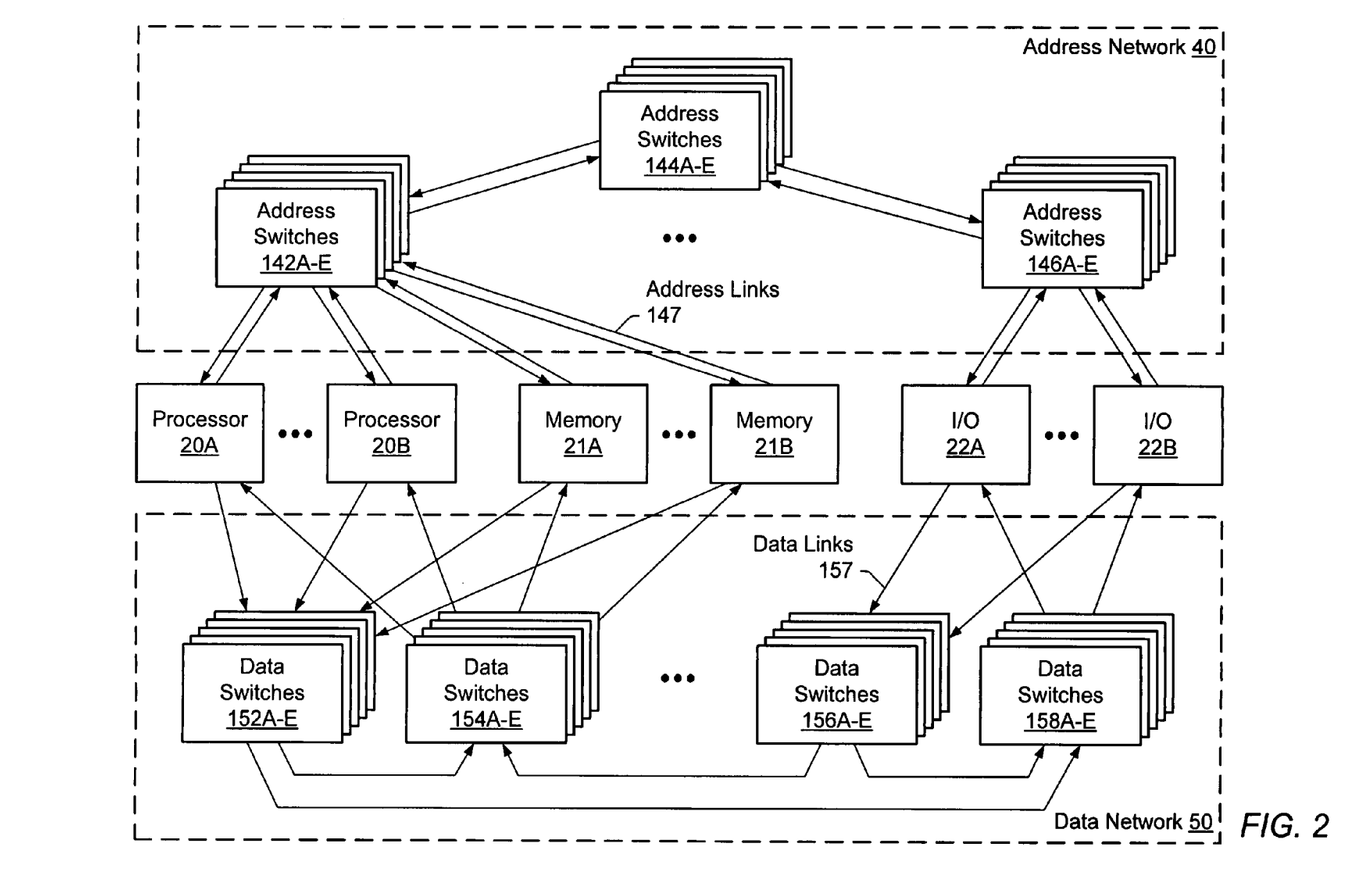
FIG. 2 is block diagram of another embodiment of a computer system.

FIG. 2 shows a block diagram of another embodiment of computer system 10. Like the embodiment of FIG. 1, computer system 10 of FIG. 2 includes multiple clients interconnected through an address network 40 and a data network 50. In the illustrated embodiment, address network 40 is implemented as a multi-stage packet-switched network and data network 50 is implemented as a two-stage packet-switched network. Each network includes several network switches. Clients may include processor clients 20A-20B, memory clients 21A-21B, and I/O clients 22A-22B, as shown in FIG. 2. It is noted that although only two clients from each category are shown in the illustrated embodiment, other embodiments may include different numbers and/or types of clients. Additionally, in alternative embodiments, single-stage address and/or data networks and/or point-to-point links directly coupling client devices (e.g., by coupling each memory device 21 to each other client device) may be used to implement address network 40 and/or data network 50.

In FIG. 2, address network 40 includes (at least) three groups of address switches, labeled 142A-E, 144A-E and 146A-E. Each address switch (e.g., address switch 142A) may be implemented in one or more integrated circuits, each containing many individual switches and circuits. In the illustrated embodiment, each address switch group (e.g., 142, 144, and 146) includes five switches A-E. Each switch A-E is used to implement a respective slice of the five-slice address network. For example, address switch 142A may be used to communicate packet slices conveyed in address network slice 0, address switch 142B may communicate packet slices conveyed in address network slice 1, and so on. Each slice may be used to convey a different portion of an address packet. For example, slices 0-3 may be used to convey a respective portion of the body of the address packet, including a respective portion of error code (i.e., an error detecting and/or correcting code) in some embodiments. Slice 4 may be used to convey parity information or other redundant information associated with the address packet conveyed by the other slices 0-3. Note that in other embodiments, address network 40 may be broken up into other numbers of slices.

In the illustrated embodiment, data network 50 is also subdivided into five slices. Data network 50 includes (at least) four groups of data switches, labeled 152A-E, 154A-E, 156A-E, and 158A-E. Like an address switch, a data switch may be implemented as one or more integrated circuits, each containing many individual switches and circuits. In this embodiment, each data switch group (e.g., 152, 154, 156, and 158) includes five switches, and each switch is used to implement a respective one of the five data slices. For example, data switch 152A may be used to communicate data packet slices conveyed in slice 0, data switch 152B may be part of data network slice 1, and so on. Data switch 152E may be part of slice 4, which may be used to convey a portion of a data packet that includes redundant information associated with the data packet portions conveyed in slices 0-3. Slices 0-3 may each be used to convey respective portions of a data packet and, in some embodiments, error code information included in a particular data packet. It is noted that in other embodiments, data network 50 may include other numbers of slices. Note also that data network 50 and address network 40 may be subdivided into different numbers of slices in some embodiments.

Address links 147 are used to interconnect clients to address switches and address switches to other address switches. Similarly, data links 157 are used to interconnect clients to data switches and data switches to other data switches. Several address links 147 and data links 157 may each be respectively coupled to an address interface (not shown) and a data interface (not shown) on each client. An address interface may be unidirectional, point-to-point, and source-synchronous and may include an address-in port and/or an address-out port. A data interface may also be unidirectional, point-to-point, and source-synchronous and may include a data-in port and a data-out port.

In one embodiment, each address-in port of a client may be either a five- or a ten-link port depending on whether the port is configured as a "narrow" (5-link) or a "wide" (10-link) port. Each link may include 12 signal lines in one embodiment. In other embodiments, fewer or additional different port widths may be supported. In a five-slice address network, four narrow links may be used to implement a respective network slice. Alternatively, two wide links may be used to implement each address network slice. Note that other embodiments may include other numbers of links and/or other numbers of signal lines per link.

Figure 3:
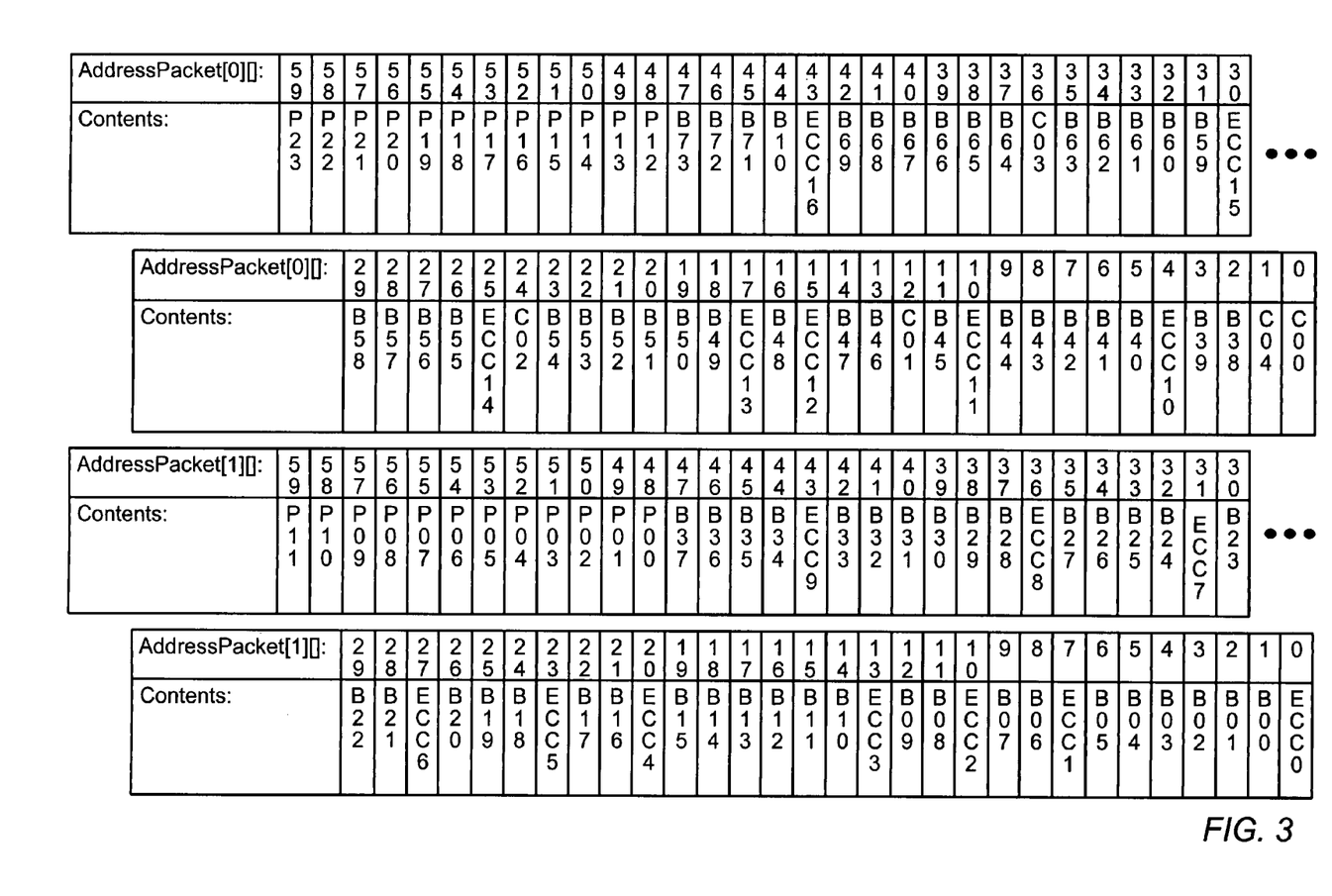
FIG. 3 is a diagram of one embodiment of an address packet.

FIG. 3 shows a diagram of an exemplary address packet, according to one embodiment. The illustrated address packet includes 120 bits and is shown in two sections of 60 bits each. The two sections of the address packet are respectively designated Address Packet [0] [59:0] and Address Packet [1] [59:0]. Collectively, the two portions are described as Address Packet [1:0] [59:0]. The various bits of each packet may be assigned to bit positions [0-59] within sections 0 and 1. Each section may be transferred over address links 147 during a different clock phase, or beat. Note that address packets of different sizes and numbers of subsections may be used in other embodiments.

An address packet includes an address body field. In the illustrated embodiment, the address body field includes 74 bits, labeled B0-B73. The address body field may include an address, a device identifier (e.g., identifying the device that initiated a transaction of which the current packet is a part), a packet identifier (e.g., identifying the transaction of which the current packet is a part), and a command encoding. Different command encodings may be used to request different types of access rights (e.g., read or write) to a particular coherency unit within a memory subsystem. Other command encodings may be used to request access to a non-cacheable data.

The illustrated address packet also includes a five-bit packet class field, labeled C0-C4. The packet class may identify whether the packet is a null or non-null packet. All bits in the address body field of a null packet may be zero in some embodiments.

An address packet may also include an error code field and/or a parity field. The illustrated address packet includes 17 error code bits, labeled ECC0-ECC16, and 24 parity bits, labeled P0-P23. It is noted that other embodiments may include packets having different fields and/or different numbers of bits within each field than those illustrated in FIG. 3. Additionally, some embodiments may include other types of redundant information instead of or in addition to parity information.

Assuming a five-slice address network as shown above, each section (e.g., 0 or 1) of the packet shown in FIG. 3 may be conveyed in five packet slices. For example, the first section Address Packet [0] [59:0] may be sliced: [59:48], [47:36], [35:24], [23:12], and [11:0]. Each packet slice may be sent on a different network slice. Accordingly, in this example, the parity bits P23-P12 from the first section and then P11-P0 from the second section are conveyed in a different network slice than the other packet bits of each section. The error code bits ECC0-ECC16 are intermingled with the other packet bits within each other packet slice in this example.

The parity bits included in each address packet may be calculated from other bits in the address packet using the using the exclusive-or (XOR) function. Thus, in this example, the parity bits may be calculated from the address body, packet class, and error code fields. In one embodiment, each parity bit may be calculated by XORing a bit from each of the other packet slices. For example, P23 may be calculated by XORing B73 (Address Packet [0] [47]), B63 (Address Packet [0] [35]), B54 (Address Packet [0] [23]), and B45 (Address Packet [0] [11]). The parity check bits P0-P23 are redundant information bits that may be used to regenerate a slice of an address packet if one of the address network slices fails to correctly convey an address packet slices. One of the Boolean properties of the XOR function is that if A XOR B XOR C XOR D=E, then E XOR B XOR C XOR D=A. As a result, if A is lost or erroneous, it may be recreated using E, D, B and C. Accordingly, the bits within any one address packet slice may be recreated from the bits within the other slices and the parity bits.

The error code bits in each packet may include error detecting and/or error correcting code bits that may be used to detect and/or correct various classes of errors in the address body and packet class bits of the packet. For example, in one embodiment, the error code bits 0-16 may be used to detect double bit errors and correct single bit errors that occur within the packet. Various different types of error detection/correction codes, such as checksums, cyclic redundancy codes (CRC), Hamming codes, Reed-Solomon codes, etc., may be used to calculate the error code bits from the address body and packet class bits. In one embodiment, the error code may be implemented in accordance with that described in U.S. Pat. No. 6,453,440, titled "System and Method for Detecting Double-bit Errors and for Correcting Errors due to Component Failures," which is hereby incorporated by reference in its entirety as though completely and fully set forth herein.

Note that since the error code bits are calculated from the address body and packet class fields, the parity bits that depend on the error code bits may also be calculated directly from the address body and packet class fields. In other words, some embodiments may calculate the parity bits independently of the error code bits. This may allow the parity bits to be calculated in parallel with the error code bits. Other embodiments may instead calculate the parity bits whose values depend on certain error code bits from those error code bits.

Like address packets, data packets may include data body, packet class, error code, and parity (or other redundant information) fields. As with the address packet illustrated in FIG. 3, the parity bits or other redundant information for a data packet may be sent in a different slice of the data network than the other bits of the data packet. Thus, in the event of an error or failure in a given slice, the parity bits may be used in conjunction with the contents of the other slices to recreate the contents of the failed slice.

It is noted that in an alternative embodiment, more than one address or data network slice may be used to convey redundant information. In one such embodiment, each redundant packet slice may include redundant information for information contained in a subset of the other packet slices. For example, assuming a network has eight slices 0-7, packet slice 0 may include redundant information for packet slices 1-3 and packet slice 4 may include redundant information for packet slices 5-7. In such an embodiment, the redundant information may support the reconstruction of more than one lost or erroneous packet slice. For example, one slice within slices 0-3 and one slice within slices 4-7 may fail at the same time. Assuming no other slices are failed, both failed packet slices may be reconstructed. Techniques for detecting failed slices are described in more detail below.

Packet Transmission

Figure 4A:
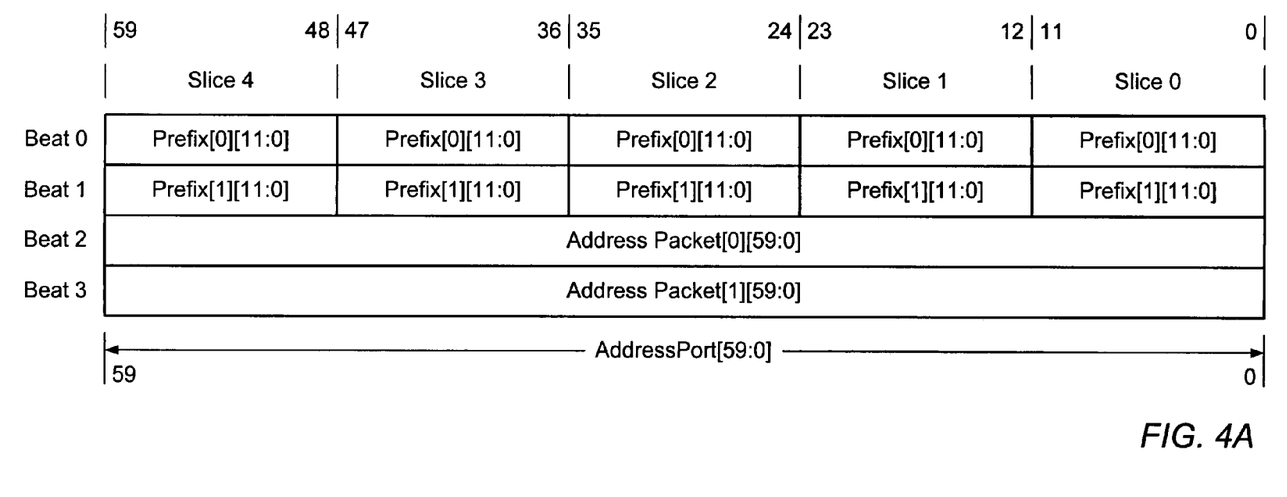
FIG. 4A illustrates how an address packet may be conveyed upon an address network in one embodiment.
Figure 4B:
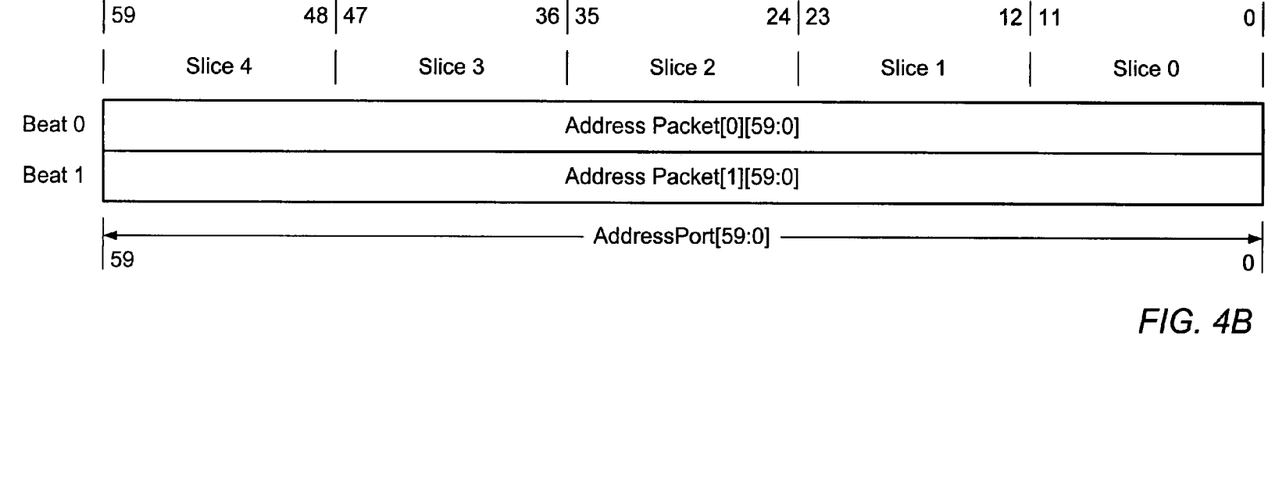
FIG. 4B shows how an address packet may be conveyed upon an address network in another embodiment.

FIG. 4A and FIG. 4B illustrate two examples of address packets that may be conveyed between clients and address switches. In these examples, an exemplary 120-bit wide address packet is shown. Depending on the size of the interface receiving the packet, the address packet may be sent using one or more clock phases, or beats. For example, fewer beats may be used to convey the address packet if the receiving interface is relatively wide than if the receiving interface is relatively narrow. In one embodiment, receiving interfaces may be sized so that a packet may be sent in two beats (e.g., if packets are 120 bits wide, each receiving interface may be 60 bits wide). Other embodiments may have interfaces sized to send and receive an entire packet in a single beat.

An address packet sent from a client to an address switch may be preceded by (or include) a routing prefix. Address switches may use this routing prefix to determine how an associated address packet should be conveyed. For example, if the routing prefix indicates the packet's destination client(s), an address switch may use that information to identify the address switch port(s) from which the packet should be output. If the routing prefix indicates a particular virtual channel in which the packet is being transmitted, that information may be used when arbitrating between various packets waiting to be routed by the address switch. Examples of information that may be included in a routing prefix include: all or part of an address being accessed, destination device identification, flow control information, and information identifying what type of address packet, if any, includes or follows the routing information. In some embodiments, the type of address packet may determine which virtual network, if any, that address packet is transmitted in. In embodiments that do not use address switches to route address packets, packets may not include or be preceded by routing information.

When networks are implemented in multiple slices as described above, identical routing prefixes may be sent on each slice. For example, looking at FIG. 2, an address packet sent by processing subsystem 20A may be preceded by routing prefix information on all five address network slices. The five address switches 142A-E that receive the respective slices of the address packet from processing subsystem 20A may each receive the identical routing prefix information in the same beat. The address switch 142 in each address network slice may use the identical copy of the routing information received by that slice to determine how and when to route the accompanying address packet slice received by that address switch. For example, if the routing information indicates the target address of a coherency transaction initiated by the accompanying address packet, each address switch 142 may access a routing table to identify the memory subsystem 21 (or other destination device) to which the address packet slice should be routed. If the routing information identifies a particular virtual channel in which the accompanying address packet slices are being routed, each address switch 142 may use that information to determine when the accompanying address packet slice received by that switch should be routed relative to any other pending address packet slices. For example, if packets conveyed in one virtual channel have priority over packets in other virtual channel(s), each address switch may determine whether a respective packet slice should be conveyed ahead of another packet slice dependent on each packet slice's virtual channel.

Since each network switch in each slice receives the same routing prefix information, each network switch 142 may select a respective slice of the same packet for forwarding on a respective slice of the same network link during the same beat. For example, if a routing prefix for an address packet indicates that the address packet should be routed to memory 21B, address switches 142A-E may each select to output a respective slice of that address packet from an output port coupled to memory 21B. The routing prefix information may also provide each address switch 142A-E with information indicating the relative time at which a respective slice of that address packet should be output to memory subsystem 21B. Accordingly, each network switch 142A-E may output a respective slice of that address packet to memory subsystem 21B during the same beat(s). Stated another way, the use of identical routing prefixes on each network slice may allow network slices to remain synchronized such that slices of the same packet are conveyed during the same beat(s).

An address packet sent from an address switch to a client may not include a routing prefix. Address switches may be configured to remove or otherwise inhibit the sending of the routing prefix to client devices when conveying the address packet to the destination client device(s). This may improve address network bandwidth in some embodiments.

FIG. 4A illustrates an address packet that may be conveyed from a client to an address switch in one embodiment. A routing prefix precedes the packet. During each beat, a portion of the address packet or several copies of a portion of the routing prefix are conveyed, in parallel, over five address network links. Each link includes 12 signal lines in this embodiment. As described above, the address packet may be divided into several slices with at least one of the slices conveying redundant information for the other slices. The illustrated embodiment shows how the various portions of the routing prefix and the address packet are divided into five slices. Each packet slice is conveyed over a corresponding 12-signal link.

In this particular embodiment, conveying the address packet and routing prefix takes four beats. During beat zero, an identical copy of the first half of the routing prefix is sent on all five slices. During beat one, an identical copy of the second half of the routing prefix is sent on all five slices. During beat two, the first half of the Address Packet [0][59:0] is sent. Different portions of the address packet are conveyed on each slice. Assuming the address packet is organized as shown in FIG. 3, the redundant information included in the first half of the address packet may be sent on slice 4. During beat three, the second half of the Address Packet [1][59:0] is sent. The redundant information included in the second half of the address packet may also be conveyed on slice 4. Thus, in the illustrated embodiment, slices 0-3 may convey address body, packet class, and error code bits, and slice 4 may convey the parity bits.

FIG. 4B shows an example of how an address packet may be conveyed from an address switch to a client in one embodiment. As mentioned above, in many embodiments, when an address packets is sent from an address switch to a client, the address packet may not be preceded by a routing prefix. FIG. 4B illustrates how the various portions of the address packet are divided into slices and sent across the address network. Each slice is conveyed over a corresponding 12-signal link. Since there is no routing prefix to send, the packet is sent over 2 beats. During beat zero, the first half of the address packet [0][59:0] is sent. During beat one, the second half of the address packet [1][59:0] is sent. As in FIG. 4A, slices 0-3 may convey address body, packet class, and error code bits, and slice 4 may convey the parity bits.

Figure 5:
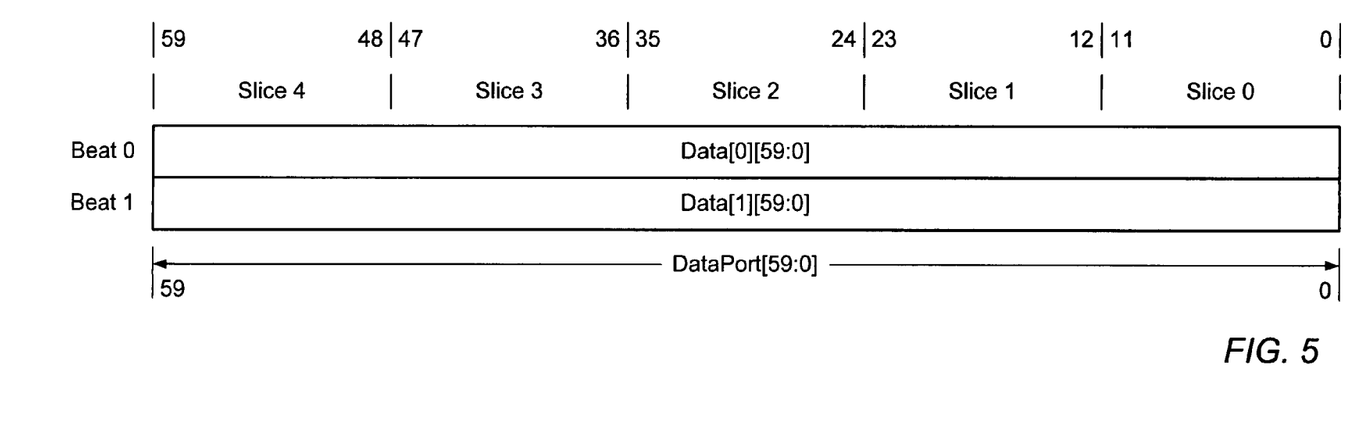
FIG. 5 is a diagram of how a data packet may be conveyed upon a data network in one embodiment.

FIG. 5 illustrates how a data packet may be conveyed between clients and data switches on the data network in one embodiment. In some embodiments, data packets of different lengths may be sent out over the data network. For example, in some embodiments, either "short" data packets or "long" data packets may be sent. In one such embodiment, short data packets may be 120 bits in size and long data packets may be 720 bits in size. It is noted that in other embodiments, other types of data packets may be used that include other numbers of bits and other formats. Furthermore, some embodiments may restrict packets to a single length, while other embodiments may support multiple packet lengths or even variable packet lengths.

Similar to the address packets described above, data packets sent from a client to a data switch or from a data switch to another data switch may be preceded by a routing prefix. However, since client devices do not need to route received packets, data packets sent from a data switch to a client may not be preceded by a routing prefix. Thus, data switches may be configured to remove or otherwise inhibit the sending of data packet routing prefixes to client devices.

Similar to the address packet shown in FIG. 3, a 120-bit short data packet may include a 74-bit short data body, a five-bit packet class, 17 error code bits, and 24 parity bits. A 720-bit long data packet may include a 576-bit long data body, an eight-bit packet class, 30 error code bits, and 144 parity check bits. The parity bits of the data packets may be calculated in a manner similar to the calculation for an address packet.

In FIG. 5, a short data packet is being sent from a data switch to a client. Accordingly, the short data packet is not preceded by a routing prefix. FIG. 5 illustrates how the various portions of the short data packet are sent and divided across the slices. Each slice may be conveyed over a corresponding 12-signal link in this embodiment. The data packet is sent out over two beats. During beat zero, the first half of the short data packet [0][59:0] is sent. During beat one, the second half of the short data packet [1][59:0] is sent. In the illustrated embodiment, slices 0-3 may convey data body, packet class, and error code bits, and slice 4 may convey the parity bits associated with the information conveyed in slices 0-3.

In embodiments that include five network slices, four slices may be used in certain situations. For example, if one slice fails, the network may continue to operate using the remaining four slices. In such situations, client devices may continue to send packets on all five slices (i.e., client devices may be unaware of the network slice failure). However, the information sent on the bad slice may effectively be ignored by packet recipients. If the bad slice is used to convey information other than the redundant information, that information may be regenerated at each receiving device through use of the redundant information. In other embodiments, client devices may be aware of network slice failures and actively adjust which portions of a packet are sent on each non-failed slice in response to a failure. Accordingly, if one slice fails, the client devices may not send any information on the failed slice in response to a failure being detected. For example, if slice 2 fails, the client devices may be configured to send non-redundant data that would otherwise have been conveyed on slice 2 on the slice normally used to convey redundant data.

Note that other embodiments may slice a packet differently (e.g., into different numbers of slices or into slices that include both redundant and non-redundant information) than described above and/or use a different number of network slices to transmit each packet. For example, each packet may be subdivided into eight slices and eight network slices may be used to convey each packet.

Packet Error Detection and Correction

Using a combination of the parity bits and the error code bits in a packet, client devices may detect and/or correct certain classes of errors within a packet. Client devices may also detect errors within a slice and, based on these errors being detected, a slice may be identified as faulty and shut down (e.g., by a service processor 25). In addition, once a slice is shut down, a slice may be brought back online with the intervention of a service processor 25 or other processor device, such as processor devices 20 of FIG. 1.

From the foregoing descriptions, it is shown that using network slices to convey address and data information between clients may improve the system reliability and availability. In addition, depending on the physical configuration of the system, network slicing may allow improved accessibility. As described in greater detail below, address and data switches may be partitioned such that address and data switches in each network slice may be implemented as an independent field replaceable hardware unit (FRU).

Figure 6:
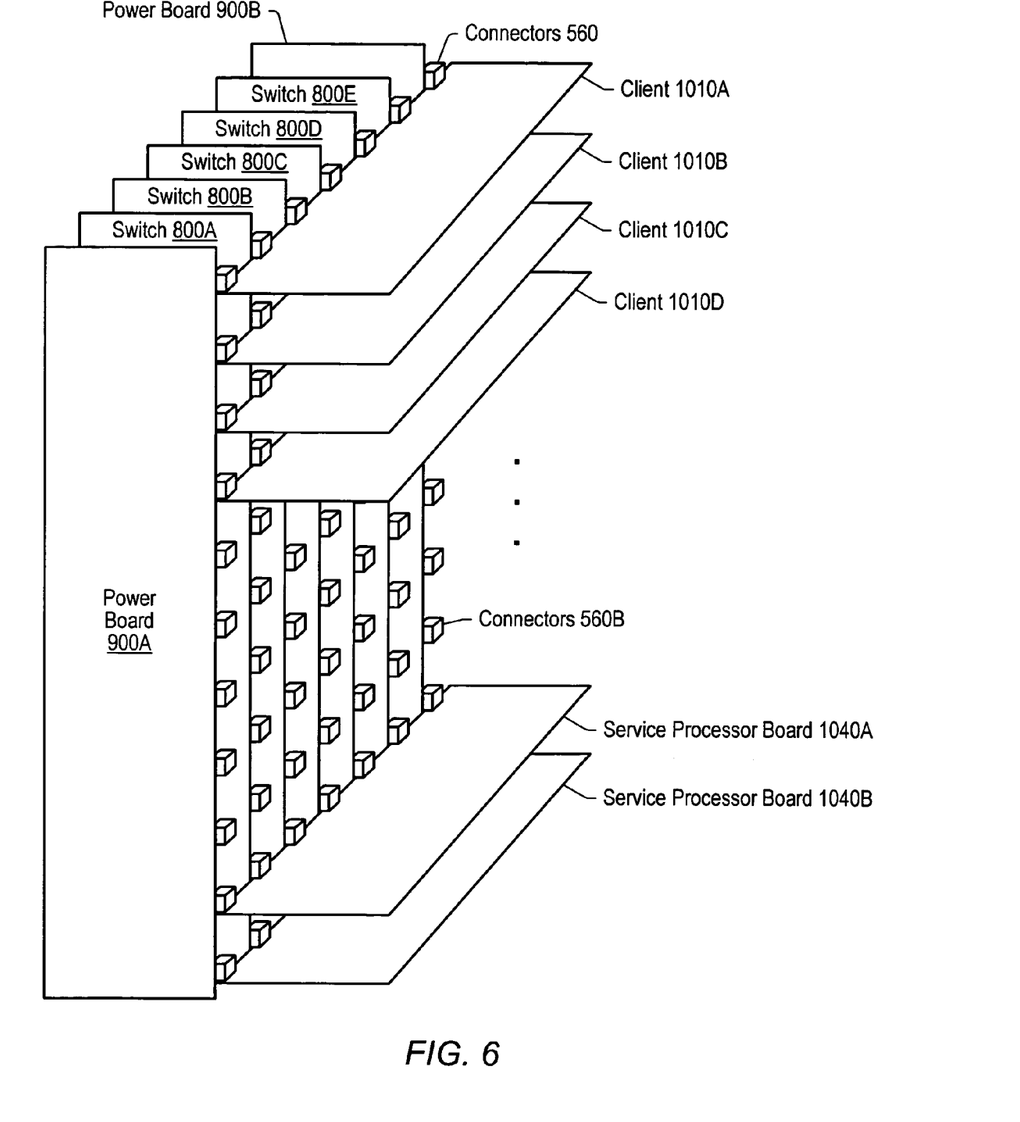
FIG. 6 is a perspective view diagram of one embodiment of the computer system of FIG. 1.

Turning now to FIG. 6, a perspective view diagram illustrating the physical configuration of one embodiment of computer system 10 of FIG. 1 is shown. FIG. 6 illustrates the physical positioning of the various circuit boards described above. The arrangement of the various circuit boards may provide a centerplaneless computer system design. Computer system 10 includes five switch boards labeled 800A-E, two power boards labeled 900A and 900B, four client boards labeled 1010A-D and two service processor boards labeled 1040A-B. In addition, switch boards 800 and power boards 900 include connectors 560B, which are shown collectively as connectors 560 when mated together with corresponding connectors on client boards 1010 and service processor boards 1040. It is noted that although only four client boards 1010, two power boards 900 and five switch boards 800 are shown, other embodiments are contemplated which may use other numbers of these boards.

In the illustrated embodiment, power boards 900A-B are each configured to distribute 48VDC to client boards 1010A-D and to service processor boards 1040A-B. Service processor boards 1040A-B are configured to redundantly distribute the 48VDC, A and B, to each of switch boards 800A-E. This power distribution scheme allows both the vertical and horizontal boards to be redundantly powered. If there is a failure of any part of the power distribution system, the computer system may continue to operate normally. Further, the failed power component may be removed and replaced during system operation. Thus, the power distribution scheme in the illustrated embodiment may prevent any single point of failure within the power distribution system from causing a catastrophic shut down or system crash. Note that in alternative embodiments, it is contemplated that client boards 1010A-D may be used to distribute 48VDC, A and B to each of switch boards 800A-E.

It is further noted that although two power boards are used in the system described above, other embodiments are contemplated which may use different numbers of power boards to distribute power. For example in such a system, N+1 power boards may be provided, and N boards may be operational and necessary to supply power at any given time. Thus the redundant board may be used in the event of a failure of one of the N power boards. Therefore, in the embodiments described above which use two boards, N is equal to 1. However, in other embodiments, N may equal 2 or more.

In addition to the power distribution system redundancy, any component in the computer system, (e.g., a service processor board 1040, a switch board 800 and a client board 1010) may be removed and replaced by service personnel while the computer system continues to operate. This feature is sometimes referred to as "hot swapping" a component. Thus, the physical implementation illustrated in FIG. 6 not only provides access to each system component but also provides hot swappable capability to any system component. Each system component may be referred to as a FRU. In some embodiments, more than one component may be hot swapped at any given time.

As described above in conjunction with FIG. 2 through FIG. 5, another feature of the system that may provide redundancy, as well as hot swap capability, is the slicing of the address and data network. In the illustrated embodiment, each of switch boards 800A-E represents one of the network slices. More particularly, each of switch boards 800A-E is a circuit board including a plurality of data switches (not shown) and a plurality of address switches (not shown) and the associated signal routing traces. For example, switch board 800A may include address switch circuits and data switch circuits that correspond to address switch 142A and data switch 152A of FIG. 2, respectively. As such, a failure of any switching component may be overcome by a fail-over mechanism. Since error detecting/correcting codes are sent with address and data packets and the parity information is conveyed on a redundant slice, any information lost due to faulty switch board components or the associated signal routing of one network slice may be reconstructed. Thus, if any switch board 800 is faulty, the address and data information may be conveyed over the four remaining switch boards as described above.

In one implementation, service processor 25 may notify an operator and/or service personnel of the failure and shutdown the failed slice. In other implementations, service processor 25 may simply notify an operator and/or service personnel of the slice failure without shutting down the failed slice. In either case, as described above, when a network slice failure is detected, the system will continue to operate.

Once notified, service personnel may have options when an FRU corresponding to a network slice fails. For example, if a spare FRU is available, service personnel may hot swap the failed FRU to fix the system immediately. Alternatively, service personnel have the option of leaving the failed FRU in place and waiting until more than one slice fails or the system is scheduled for down time. Thus, the effective mean time between system failures may be increased.

It is noted that other physical configurations of computer system 10 are possible and contemplated. For example, the computer system 10 shown in FIG. 1 and FIG. 2 may be physically implemented using a more conventional configuration having a centerplane (not shown). In such an embodiment, each network slice may be implemented using a switch card module including address and data switches corresponding to one slice. Similar to the configuration above, each such network slice (and thus each switch card module) may be an FRU that may or may not be hot swappable. As such, the system may continue to operate after a failure of one or more network slices, depending on the number of slices containing redundant information, regardless of whether the FRU is hot swappable.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer system, comprising:
   a first client subsystem;
   a second client subsystem; and
   a network coupled to convey a packet between the first client subsystem and the second client subsystem, wherein the network includes a plurality of network slices;
   wherein the packet is partitioned into a plurality of packet slices, each conveyed on a respective one of the plurality of network slices;
   wherein at least one of the plurality of packet slices includes redundant information associated with the packet and is usable to regenerate at least another of the plurality of packet slices; and
   wherein each of the plurality of network slices corresponds to a field replaceable hardware unit.

2. The computer system as recited in claim 1, wherein each field replaceable hardware unit is a switch circuit board including address and data switches configured to route a corresponding packet slice.

3. The computer system as recited in claim 1, wherein each field replaceable hardware unit is hot swappable.

4. The computer system as recited in claim 1, wherein the second client subsystem is configured to regenerate the at least another of the plurality of packet slices using the redundant information conveyed in the at least one of the plurality of packet slices.

5. The computer system as recited in claim 1, wherein the first client subsystem is configured to generate the redundant information by computing parity of the plurality of packet slices.

6. The computer system as recited in claim 1, wherein the network includes a data network that includes a plurality of data network slices, wherein the first client subsystem is configured to convey a data packet to the second client subsystem via the data network by conveying each of a plurality of data packet slices on a respective one of the plurality of data network slices.

7. The computer system as recited in claim 6, wherein the first client subsystem is configured to convey redundant information associated with the data packet to the second client subsystem via at least one of the plurality of data packet slices.

8. The computer system as recited in claim 7, wherein the second client subsystem is configured to recreate at least another of the plurality of data packet slices using the redundant information included in the at least one data packet slice.

9. The computer system as recited in claim 1, wherein the network includes an address network that includes a plurality of address network slices, wherein the first client subsystem is configured to convey an address packet to the second client subsystem via the address network by conveying each of a plurality of address packet slices on a respective one of the plurality of address network slices.

10. The computer system as recited in claim 9, wherein the first client subsystem is configured to convey redundant information associated with the address packet to the second client subsystem via at least one of the plurality of address packet slices.

11. The computer system as recited in claim 10, wherein the second client subsystem is configured to recreate at least another of the plurality of address packet slices using the redundant information included in the at least one address packet slice.

12. A method, comprising:
    conveying a packet between a first client subsystem and a second client subsystem via a network including a plurality of network slices, wherein the packet is partitioned into a plurality of packet slices; and
    conveying each packet slice on a respective one of the plurality of network slices;
    wherein at least one of the plurality of packet slices includes redundant information associated with the packet and is usable to regenerate at least another of the plurality of packet slices; and
    wherein each of the plurality of network slices corresponds to a field replaceable hardware unit.

13. The method as recited in claim 12, wherein each field replaceable hardware unit is a switch circuit board including address and data switches configured to route a corresponding packet slice.

14. The method as recited in claim 12, wherein each field replaceable hardware unit is hot swappable.

15. The method as recited in claim 12, wherein the second client subsystem regenerating the at least another of the plurality of packet slices using the redundant information conveyed in the at least one of the plurality of packet slices.

16. The method as recited in claim 12, wherein the first client subsystem generating the redundant information by computing parity of the plurality of packet slices.

17. The method as recited in claim 12, wherein the network includes a data network that includes a plurality of data network slices, the first client subsystem conveying a data packet to the second client subsystem via the data network by conveying each of a plurality of data packet slices on a respective one of the plurality of data network slices.

18. The method as recited in claim 17 further comprising the first client subsystem conveying redundant information associated with the data packet to the second client subsystem via at least one of the plurality of data packet slices.

19. The method as recited in claim 18 further comprising the second client subsystem recreating at least another of the plurality of data packet slices using the redundant information included in the at least one data packet slice.

20. The method as recited in claim 12, wherein the network includes an address network that includes a plurality of address network slices, the first client subsystem conveying an address packet to the second client subsystem via the address network by conveying each of a plurality of address packet slices on a respective one of the plurality of address network slices.

21. The method as recited in claim 20 further comprising the first client subsystem conveying redundant information associated with the address packet to the second client subsystem via at least one of the plurality of address packet slices.

22. The method as recited in claim 21 further comprising the second client subsystem recreating at least another of the plurality of address packet slices using the redundant information included in the at least one address packet slice.

* * * * *

UNITED STATES PATENT AND TRADEMARK OFFICE
CERTIFICATE OF CORRECTION

PATENT NO. : 7,607,069 B1　　　　　　　　　　　　　　　　　　　　　Page 1 of 1
APPLICATION NO. : 10/917167
DATED : October 20, 2009
INVENTOR(S) : Cypher et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1366 days.

Signed and Sealed this

Twelfth Day of October, 2010

David J. Kappos
*Director of the United States Patent and Trademark Office*